United States Patent [19]
Eichelberger et al.

[11] Patent Number: 4,522,888
[45] Date of Patent: Jun. 11, 1985

[54] ELECTRICAL CONDUCTORS ARRANGED IN MULTIPLE LAYERS

[75] Inventors: Charles W. Eichelberger, Schenectady; Robert J. Wojnarowski, Clifton Park, both of N.Y.

[73] Assignee: General Electric Company, Schenectady, N.Y.

[21] Appl. No.: 497,977

[22] Filed: May 25, 1983

Related U.S. Application Data

[62] Division of Ser. No. 220,341, Dec. 29, 1980, Pat. No. 4,416,914.

[51] Int. Cl.$^3$ ............................ C23C 3/02; H05K 3/00
[52] U.S. Cl. .................................. 428/546; 428/699; 428/901; 427/103; 427/123; 427/436
[58] Field of Search ............... 428/546, 901, 209, 210, 428/699; 427/98, 102, 103, 123, 205, 436

[56] References Cited
U.S. PATENT DOCUMENTS 3,332,860  7/1967  Diebold et al. ..................... 204/38
4,284,665  8/1981  Heimala et al. ..................... 427/203

FOREIGN PATENT DOCUMENTS 52-8504  4/1977  Japan .................................. 427/123

OTHER PUBLICATIONS

"Radiation Curable Corrective Ink", Bolon et al., Proceedings of the 13th Electrical/Electronics Insulation Conference, Chicago, Ill., (Sep. 1977), pp. 108–111.

Primary Examiner—Teddy S. Gron
Assistant Examiner—Anne Brooks
Attorney, Agent, or Firm—Geoffrey H. Krauss; James C. Davis, Jr.; Marvin Snyder

[57] ABSTRACT

A low-cost electrical conductor is prepared by applying a mixture of a metallic powder and a polymer on a substrate, curing the polymer, effecting an augmentation replacement reaction to replace some of the metallic powder with a more noble metal in such a way that the total volume of deposited metal at the surface exceeds that of the original metal powder replaced, and thereafter applying a dielectric material to selected areas of the conductor thus formed. Imperfections such as pin holes and screen marks can be eliminated by heating the dielectric material to cause a degree of flow. Multiple layer interconnected conductors can be prepared by reapplying the mixture of metallic powder and polymer such that a portion thereof contacts the first prepared conductor, curing the polymer and effecting an augmentation replacement reaction with a metal which is more noble than the powder metal and the replacement metal of the first conductor.

19 Claims, 5 Drawing Figures

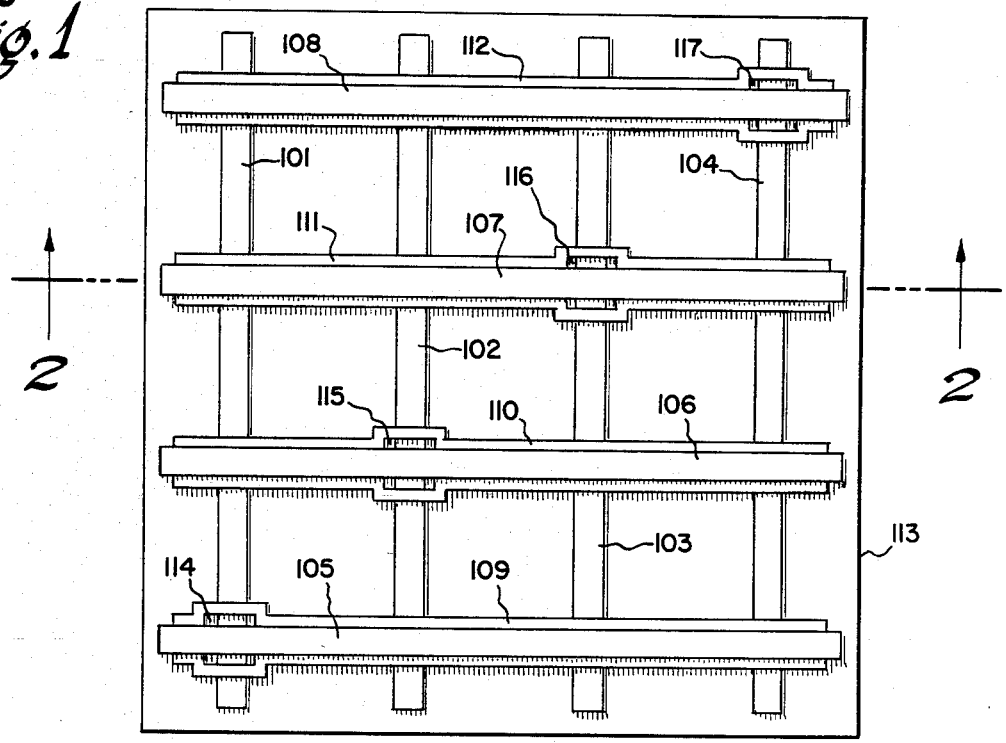
Fig.1
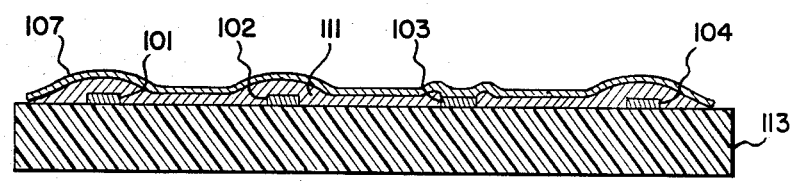
Fig.2
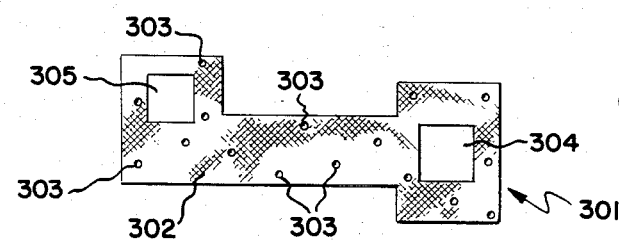
Fig.3
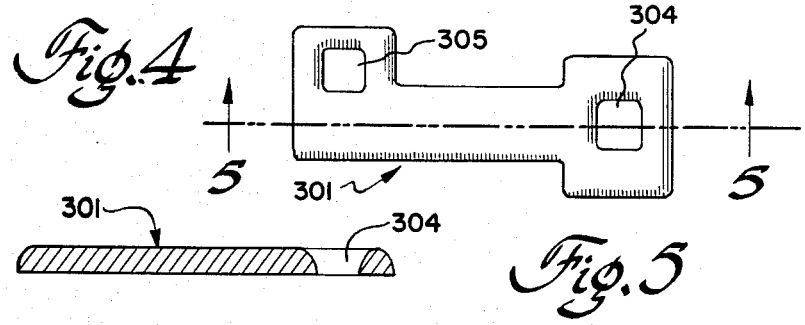
Fig.4
Fig.5

ELECTRICAL CONDUCTORS ARRANGED IN MULTIPLE LAYERS

This application is a division of application Ser. No. 220,341, filed 12/29/80, now U.S. Pat. No. 4,416,914.

Related Applications—include applications Ser. Nos. 220,341, now U.S. Pat. No. 4,416,941, issued Nov. 22, 1983; 220,342, now U.S. Pat. No. 4,404,237, issued Sept. 13, 1983; 220,343; now U.S. Pat. No. 4,380,749, issued Apr. 19, 1983; 220,344 now U.S. Pat. No. 4,345,236, issued Aug. 17, 1982; and 220,937 now U.S. Pat. NOs. 4,377,505 and 4,438,158 respectively issued Mar. 22, 1983 and Mar. 20, 1984; and application Ser. No. 220,332, now U.S. Pat. No. 4,385,082, issued May 24, 1983.

BACKGROUND OF THE INVENTION

Many types of electronic apparatus are known in which various electrical components are interconnected by conductors. The interconnecting conductors are fabricated in a wide variety of processes such as, for example, thick film fired conductor systems, polymer conductors and printed circuit boards. As the complexity of such apparatus (such as a circuit board and the like) increases, the requirement for the conductive layers to cross over one another and to make layer-to-layer connections also increases.

In thick-film fired conductors, a mixture of a conducting metal powder, a ceramic or glass binder and an appropriate vehicle is screen printed on a substrate. The conductor pattern on the substrate is then fired at a relatively high temperature, typically between 650° and 900° C. As the temperature rises to the firing temperature, the vehicle is volatilized leaving the metal and binder behind. At the firing temperature, sintering of the metal takes place to a greater or lesser extent with the binder providing adhesion between the metal film formed and the substrate.

Thick film fired conductors have classically employed precious metals such as gold, silver, platinum and palladium. Recently these noble metals have soared in cost, and new conductor systems using copper, nickel and aluminum are being made commercially available. The cost of the precious metal systems is prohibitive where a low cost conductor system is desired. The newer metal systems are not significantly cheaper because of the special chemistry which is required to prevent oxidation of the metal during the firing process. Moreover, these systems are very difficult to solder using the conventional tin/lead solder and the high firing temperatures required during fabrication preclude the use of low cost substrate materials. Some of the nickel systems can be fired on soda-lime glass at temperatures just below the melting point of the glass but the resulting conductivity of the conductor is relatively low.

Thick film conductor arrangements have been prepared in which a layer of the conductor is printed and then sintered, followed by applying a layer of a dielectric material which contains gaps or holes for making connections to the first layer of conductors and which is fired, a second layer of conductor is applied such that it overlays the holes, and contact is made between the first and second conductor layers. The second conductor layer is sintered to provide connection between the first and second conductor layer through the holes as desired. This technique, however, is undesirable because it is both costly and involves a number of complicated processing steps.

The term "polymer conductor" is actually a misnomer since the polymer is not actually a conductor. Instead, the polymer is heavily loaded with a conducting metal and screened onto a substrate. The advantage of this system is that the polymer can be cured either catalytically or thermally at temperatures which range from room temperature to about 125° C. As a result of this so-called "cold processing", it is possible to use very inexpensive substrates such as films of Mylar ® (polyethylene terephthalate). The mechanism by which conductivity is achieved is supplied entirely by contact between individual metallic particles. It has been found that the only metals which can be loaded into the polymer and give acceptable conductivity are the precious metals such as gold and silver. All of the other standard conducting metals oxidize over a period of time and the conductivity between the particles is reduced. Silver has been the predominant choice in polymer conductor systems but the silver systems are generally not solderable because the silver is leached by the lead-tin solder. When the price of silver is about $10–11 per ounce, these conductor systems are competitive with other systems if used on very low cost substrates such as thin mylar films. However, when the price of silver is higher, the systems are not competitive with printed circuit boards.

Multiple layer arrangements with conductor-to-conductor contact are achieved with polymer conductors in the same way as with the thick film conductors except that the polymer is cured rather than the film being sintered. An advantage of this process is that high temperature firing of the conductors and dielectric is not required but a problem which plagues this type of multilayer circuit is silver migration. The silver in the upper and lower levels tend to migrate through the dielectric making undesired connection between the two conductor layers. This process is accelerated by the presence of moisture and heat and by the application of high field voltages. This particular phenomenon is especially insidious because original quality control tests are passed and field failures later occur. Gold or palladium-silver loaded conductors can be used to eliminate the problem but such a solution makes the process no longer economically viable.

The techniques used to prepare printed circuit boards can be divided into additive and subtractive technologies. In both, the starting point is a substrate, which can vary widely from phenolics to glass filled epoxies, on which a copper foil is bonded. In the additive preparatory system, the copper foil is very thin, usually on the order of about 200 microinches. A resist is patterned such that the copper is exposed only where the conductors are desired and the board is then electroplated to form copper conductors of about 1 mil in thickness. The plating resist is stripped and the copper is etched. In areas where the conductor is not desired, the copper is only about 200 microinches thick so that etching quickly removes this copper while leaving a 1 mil thick conductor. In the subtractive process, the starting thickness of the copper foil is usually between 1 and 2 mils. An etch resist is deposited wherever the conductors are desired, the board is etched and the resist is then removed. The resist prevents etching where the conductors are desired leaving conductor runs.

Both the additive and subtractive printed circuit board procedures require the application of a copper foil over the entire substrate, deposition and removal of a resist, etching of the printed circuit board, drilling holes for component insertion, and in one case, the additional step of electroplating. An advantage of this technology is, however, that the resulting circuit boards can be relatively easily soldered.

Another advantage of the printed circuit board technology is that plated through holes can be fabricated. This process usually involves the addition of several steps to the additive fabrication process. Holes are drilled in the substrate before the resist is applied over all areas except where the conductors are desired. The board is then soaked in a stannous chloride sensitizer which forms a coating over the exposed parts of the substrate, namely inside the holes. The board is then sequentially dipped in a bath of palladium chloride, acid to dissolve the tin chloride, and an electroless copper bath. The last step, i.e., immersion in an electroless copper bath, deposits a very thin film of copper inside the activated hole. This "electroless copper" is plated out by a catalytic reaction in which the catalyst is copper such that a continuous plating reaction can occur. Typically, thickness on the order of 24–50 microinches can be achieved in 0.5 hour. At this point, a thin film of copper is adhered to the inside edges of the holes. The subsequent electroplating will build up the thickness of the copper within the holes as well as along all of the conductor runs. At this point, the various processes employed differ. The simplest process merely strips the resist and then etches, eliminating the much thinner copper where the conductor runs are not desired. In more complex processes, electroplating of tin-lead solder is accomplished which results in a tin-lead solder inside the hole and along the conductor runs, and is followed by etching with chromic acid which does not attack the tin-lead solder so that the solder acts as an etch resist.

The most significant drawback of the printed circuit board technology is that a substantial number of processing steps are necessary and this requires a large amount of associated equipment. In addition, the choice of substrate materials is limited to one of those available for circuit board materials. The number of process steps and equipment results in relatively high processing costs and the limitation of the substrate materials eliminates the opportunity to use a decorative or structural member, which may be required in the apparatus, as the substrate. Typical total costs for processed printed circuit boards range from $0.03 to $0.15 per square inch depending on the quality of the board and whether the board is single-sided or double-sided. Plated through holes require a large number of processing steps and the use of costly materials. Multilayer printed circuit boards presently range in cost from $0.10 to over $1.00 per square inch, depending on the number of layers and board quality factors, all of which cost is unacceptable in consumer electronic devices.

Another problem with the multilayer circuits where the dielectric material is applied by a printing technique such as screen printing, is that the viscosity of the dielectric material must be between 25 Kcps and 200 Kcps to permit such application while obtaining a suitable thickness to realize the desired insulator capacity. At such viscosities, applicator marks such as screen marks and small pin holes are formed which allow short circuits between conductor layers or to the substrate if formed of a conductor, such as steel. This problem is compounded by the fact that screen printing inks, especially those loaded with a filler, are thixotropic. Under the shear of the screening application, the ink viscosity is reduced so that it flows easily, but once in place, no shear forces are present, causing the imperfections in the dielectric to be retained. Heretofore, the standard method of improving dielectric strength was to print and cure/fire the dielectric twice, using different printing paths. While the desired results are achieved, additional labor and costs are involved.

BRIEF SUMMARY OF THE INVENTION

In accordance with the invention, multilayer circuits are prepared in accordance with the invention by applying a desired conductor design to a substrate and thereafter applying a dielectric material over selected areas of the conductor. Imperfections in the dielectric surface can be substantially eliminated by a heat treatment. A second conductor layer can be formed by applying to the substrate an ink composition containing a finely divided metal powder and a curable polymer, such that it contacts the first conductor at at least one point, curing the polymer, and effecting an augmentation replacement reaction using a metal salt in which the metal is more noble than the metal powder and the surface metal of the first conductor.

It is an object of this invention to provide a low cost, multilayer circuit system in which the conductors and dielectric layers are compatible, which can be produced at low cost without the use of high temperature processing steps, and which is free from short circuits developed by conductor migration or imperfections in the dielectric.

A further object of the invention is to provide a low cost, mutilayer conductor system in which the number of steps necessary to provide the interconnections between conductor layers is minimized and in which the voltage withstand capability of the dielectric layer can be provided without resorting to multiple printing of the same dielectric material.

Another object of the invention is to improve wetting of the substrate so that adhesion between the dielectric and substrate is improved.

These and other objects of the invention will become apparent to those skilled in the art from the following detailed description, when read in conjunction with the drawings.

BRIEF DESCRIPTION OF THE DRAWINGS

FIG. 1 is a top view of a multilayer circuit in accordance with the present invention;

FIG. 2 is a cross-section taken along line 2—2 of FIG. 1;

FIG. 3 is a plan view of a dielectric pattern in accordance with the present invention;

FIG. 4 is a plan view of the dielectric pattern of FIG. 3 after treatment to remove imperfections; and FIG. 5 is a cross-section of the dielectric pattern of FIG. 4.

DETAILED DESCRIPTION OF THE INVENTION

The first step in the process of the present invention involves the establishment of a desired conductive pattern on a substrate. The pattern may be established by conventional printed circuit techniques, on a chosen substrate, such as a glass epoxy blank and the like, laminated with conductive foil; the foil is then patterned with the desired design using conventional masking and etching techniques. Alternatively, the desired conductive pattern may be provided by means of a metal containing cured polymer which is subjected to an augmentation replacement reaction, as more fully described in co-pending application Ser. No. 220,342, filed on even date herewith, and incorporated herein in its entirety. The augmentation reaction process is particularly adapted for the use of screen printing techniques to establish the conductor patterns on the substrates, although the invention is not so limited. Other types of printing and application techniques can be used including, without limitation, pad flexographic printing, stencil, rotogravure and offset printing.

The substrate on which the conductive patterns are formed is not restricted and any insulator to which the metal ink can be adhered is employable. Thus, the usual printed circuit substrates can be used as well as glass-filled polyesters, phenolic boards, polystyrene and the like. Of particular interest as substrates for use in the present invention is glass and steel which is covered with an insulator such as porcelain or epoxy. The latter materials arre often used as structural or decorative elements in many constructions and applying electronic elements directly to them provides advantages with respect to ease of fabrication, essential structural members and cost.

The metal inks used in the present invention are a combination of a finely divided metallic powder composition with a polymer whose viscosity and flow characteristics are controlled by the incorporation of a solvent therein. The metal can be any metal which is stable in the ink and cured polymer and which can be obtained in finely divided form and which is placed above the metal used in the augmentation replacement reaction in the activity series of the metals. Because of its availability and low cost, the preferred metal is iron. The metal powder generally has a particle size of less than about 50 microns, preferably 3 to about 25 microns and most preferably about 15–25 microns. When the ink is deposited by screen printing, the metal particles must be of a size to pass through the screen.

The polymers employed in the ink are any curable material or mixture thereof which exhibits a degree of adhesion to the substrate being employed and to the finely divided metal powder which is dispersed therein. Typical polymers which can be employed include the homopolymers and copolymers of ethylenically unsaturated aliphatic, alicyclic and aromatic hydrocarbons such as polyethylene, polypropylene, polybutene, ethylene propylene copolymers, copolymers of ethylene or propylene with other olefins, polybutadiene, polyisoprene, polystyrene and polymers of pentene, hexene, heptene, bicyclo(2,2,1)2-heptane, methyl styrene and the like. Other polymers which can be used include polyindene, polymers of acrylate esters and polymers of methacrylate esters, acrylate and methacrylate resins such as ethyl acrylate, n-butyl methacrylate, isobutyl methacrylate, ethyl methacrylate and methyl methacrylate; alkyd resins; cellulose derivatives such as cellulose acetate, cellulose acetate butyrate, cellulose nitrate, ethyl cellulose, hydroxyethyl cellulose, methyl cellulose, and sodium carboxymethyl cellulose; epoxy resins; hydrocarbon resins from petroleum; isobutylene resins; isocyanate resins (polyurethanes); melamine resins such as melamine-formaldehyde and melamine-urea-formaldehyde; oleo-resins; polyamide polymers such as polyamides and polyamide-epoxy polyesters; polyester resins such as the unsaturated polyesters of dibasic acids and dihydroxy compounds; polyester elastomer and resorcinol resins such as resorcinol-formaldehyde, resorcinol-furfural, resorcinol-phenol-formaldehyde and resorcinol-urea; rubbers such as natural rubber, reclaimed rubber, chlorinated rubber, butadiene styrene rubber, and butyl rubber, neoprene rubber, polysulfide, vinyl acetate and vinyl alcohol-acetate copolymers, polyvinyl alcohol, polyvinyl chloride, polyvinyl pyrolidone and polyvinylidene chloride, polycarbonates, graft copolymers of polymers of unsaturated hydrocarbons and of unsaturated monomers such as graft copolymers of polybutadiene, styrene and acrylonitrile, commonly called ABS resins, polyamides and the like, including those additional examples detailed in the aforementioned application Ser. No. 220,342.

The polymers and inks of the present invention can contain various other materials such as fillers, e.g., glass fiber, glass powder, glass beads, asbestos, mineral fillers, wood flower and other vegetable fillers, dyes, pigments, waxes, stabilizers, lubricants, curing catalysts such as peroxides, photosensitizers and amines, polymerization inhibitors adhesion promoters, wetting agents and the like. It is preferred, but not essential, to employ a polymer which exhibits a substantial degree of volumetric shrinkage upon curing.

The amounts of the finely divided metal and polymer are adjusted such that the metal constitutes about 60–80% by volume of the mixture after curing. Preferably, the metal is about 70% by volume. It is desired to have the surface of the cured ink contain a significant amount of the metal particles to facilitate the subsequent augmentation replacement reaction.

A solvent is used in the ink formulation in order to adjust the viscosity and flow characteristics for the type of printing desired. In general, the solvent should be employed in an amount sufficient that the ink has a viscosity of 15,000–200,000 cps at room temperature and preferably about 50,000–150,000 cps. Suitable solvents or diluents can be aliphatic or aromatic and usually contain up to about 30 carbon atoms. They include the hydrocarbons, ethers and thioethers, carbonyl compounds such as esters and ketones, nitrogen containing compounds such as amides, amines, nitriles and nitro compounds, alcohols, phenols, mercaptans and halogen containing compounds. Examples include alcohols such as methanol, ethanol, propanol, benzyl alcohol, cyclohexanol, ethylene glycol, glycerol and the like, aromatic materials such as benzene, toluene, xylene, ethyl benzene, naphthalene, tetralin and the like, ethers such as methyl ether, ethyl ether, propyl ether, methyl t-butyl ether, and the like, alkanes such as methane, ethane, propane and the like, dimethyl sulfoxide, butyl formate, methyl acetate, ethyl acetate, formamide, dimethyl formamide, acetamide, acetone, nitrobenzene, monochlorobenzene, acetophenone, tetrahydrofuran, chloroform, carbon tetrachloride, trichloroethylene, ethylbromide, phenol, mercaptophenol, and the like. Additionally, reactive solvents or diluents such as triallyl isocyanurate can be used if desired. It is preferred to employ a solvent which is relatively non-volatile at room temperature so that the viscosity and flow of the ink is appropriate during application to the substrate and highly volatile at the curing temperature of the polymer or at other temperatures above the application temperature. The carbitol series of solvents and particularly butyl carbitol (diethylene glycol monobutyl ether) has been found to be particularly appropriate.

The ink is applied to the substrate to achieve the desired conductor patterns thereon. For example, standard printed circuit application technology can be employed. Any temperature which will not cause premature curing of the ink and at which the viscosity and flow characteristics of the ink are appropriate to the application technique used can be employed. It is preferred, but not necessary, to permit at least a portion of the solvent to evaporate after application of the ink to the substrate and before curing. The act of evaporation exposes addition metal powder and increases the ratio of metal powder to polymer so as to achieve a balance between sufficient metal to provide a base for the conductive film to be formed thereon and too little polymer to act as a binder to hold the metal particles. Preferably, the drying is effected for 0.1–1 hour, more preferably about 0.25–0.5 hour, at a temperature of about 70°–150° C., most preferably about 110°–130° C.

In the next step in the instant process, the ink polymer is cured or polymerized by the most convenient method. If an autocatalyst has been added, the polymer will cure by itself with no additional initiation. In the case of ultraviolet light initiators, the substrates carrying the conductor patterns can be passed under a high intensity ultraviolet source which causes the initiators to begin the curing reaction. It is presently preferred to employ a thermal curing system which is activated by exposure to temperatures of about 140°–200° C., preferably about 150°–180° C., for a time of 0.1–1 hour, preferably 0.15–0.5 hour. As a result of this step, a closely compacted metal powder bound to the substrate by the cured polymer is achieved. Because of the high percentage of metal and shrinkage of the polymer chosen, the conductive pattern thus obtained may have some conductivity due to physical contact between the metal particles. In the preferred embodiment of this invention that conductivity is on the order of about 30 Kohm per square for a one mil thick deposit. The resistance will be highly variable and increase substantially if the system is subjected to oxidizing conditions for any period of time since an oxide builds up between particles and reduces conductivity.

In some instances, it may be desirable to only partially cure the polymer. For example, occasions arise where it is desirable to mount components by inserting the leads thereof in the polymer ink. In such instances, it may be desirable to partially cure the polymer or only gel the polymer in situations where the polymer employed is gelable, so as to provide an adhesive for the lead wire.

The ink-designed substrate is subjected to an augmentation replacement reaction in which some of the metal of the powder is replaced by a metal further down in the activity series, i.e., which is more noble. This step takes advantage of the known chemical behavior of metals, i.e. that any metal will displace any succeeding, less active, metal from a water solution of one of its salts. However, in this invention, it has been found that while the powder metal enters into solution from the surface and somewhat below the surface of the polymer, the plating out of the more-noble metal takes place to a large extent on the surface. Thus, an additional amount of more-noble metal is deposited on the surface than that which would form a one-to-one exchange with the powder metal at the surface. The additional metal from the solution plates to the original and replacement metal particles which are adhered to the substrate by the polymer to interconnect all metal particles at the surface and thus form a contiguous film of conductive metal over the printed conductor pattern. It has been found that several hundred microinches of conductor material can be built up from a solution in a period of 5 minutes.

The augmentation reaction reagent is a solution, preferably inorganic and most preferably aqueous, of a metal salt. The cation of the metal salt is any more noble or electropositive metal than the metal of the finely divided powder, i.e., lies below the powder metal in the activity series, and which is electrically conductive. Any anion can be used which is relatively inert, i.e., does not deleteriously affect the process and which forms soluble salts with both the cation metal and the powder metal. Typical salts include copper nitrate, copper acetate, copper fluoroborate, potassium gold cyanide, nickel sulfate, nickel chloride, nickel sulfamate, potassium silver cyanide, silver chloride and the like. The presently preferred metal salt is copper sulfate. The concentration of the metal salt in the solution can range from 0.1 molar to saturation but is preferably about 0.5–2.0 molar. Below about 0.5 molar, deposition rates are inordinately slow and there is no improvement in rate at molarities above 2.0. Most preferably, the metal salt is present at a concentration of about 1 molar.

When copper sulfate is used as the augmentation metal, a copper layer is formed with new unoxidized copper which can be readily soldered. If further enhancement is desired or if soldering of the circuits is to be delayed for a substantial period of time, the conductor pattern formed can be dipped in a tin plating solution so that the tin will replace some of the copper. Tin and copper are very close in the activity series and the normal replacement reaction would cause copper to be plated out on the tin. However, by adding appropriate complexing ions, the tin will replace the copper. The tin plated copper thus formed is very readily soldered and can be left for periods of a month or more and good soldering can still be achieved. Suitable tin plating solutions are commercially available for plating on copper such as, for example, Coppertech Electroless Tin Plating Solution ST-210 or ST-240. The augmentation reaction can be carried out at any suitable temperature although elevated temperatures are generally preferred in order to increase reaction rate. Thus, any temperature from ambient up to about 100° C. can be employed although the temperature is preferably about 45°–60° C. Generally the augmentation reaction is completed in about 2 minutes to 20 minutes or more, preferably about 5 minutes.

The first step of the process of the present inventions is the establishment of a first conductor pattern on the substrate, by either conventional printed circuit techniques or by the augmentation reaction technique described. In the next step of the process of this invention, a dielectric material is applied over the conductor in those areas in which it is desired to be present. Any dielectric material which has previously been employed and any method of application heretofore employed can be utilized. It is preferred to employ a screen printing technique and to use a curable polymeric material, preferably an ultra-violet light-curable material, as the dielectric material. Thus, any of the curable polymers used as a binder for the powder metal described above can be employed if sufficiently non-conducting or convertible to a non-conducting material by curing or by addition of a suitable non-conducting filler. For ease of appplication, the dielectric material has a viscosity of about 25,000–200,000 centipoises and preferably 50,000–100,000 centipoises at room temperature. A number of ultra-violet curable epoxy dielectric materials are commercially available such as, for example, Dynacure mixing base GA80M and General Electric ultra-violet curable epoxies UV 1001, 1003 and 1007.

The dielectric layer deposited over the conductor generally has an imperfect surface, the nature of the imperfections varying from application system to application system. When the dielectric is applied by screen printing, the imperfections commonly take the form of pin holes and screen marks. The imperfections can be substantially eliminated by increasing the temperature which causes the viscosity of the dielectric material to be reduced to a point at which it flows and becomes self-leveling. The elevated temperature at which such effects can be observed varies from dielectric material to dielectric material and can be readily determined by a few simple experiments. With respect to the ultra-violet curing epoxy dielectric materials referred to above, temperatures of about 100°–150° C. have been found to be suitable to cause the elimination of pin holes and screen marks and additionally cause the dielectric to wet the surface of the substrate. The improved wetting of the substrate improves adhesion between the dielectric material and the substrate.

When preparing multi-layer interconnected conductors, it is necessary to leave holes or gaps in the dielectric overlying selected areas of the conductor where the interconnection is to be made. In such cases, heating the dielectric will cause the dielectric material to flow into the holes and, if not terminated, will close the holes. The holes can be maintained open by "freezing" the dielectric at a point when the imperfections such as pin holes and screen marks have been eliminated but before the holes have been unduly closed. This is accomplished by initiating the curing reaction such as, for example, positioning the assembly under a high intensity ultra-violet curing lamp. This process can be automated by placing the assembly on a conveyor belt which first encounters heating elements and then encounters high intensity UV curing lamps. An advantage to this procedure is that there is some flow of the walls of the dielectric from the hole walls and edges so that the subsequently overapplied conductors do not have to overlay abrupt changes in height. When the dielectric is applied to the conductor, the holes or gaps should be somewhat larger than desired in the final product because the procedure just described will cause the holes to be closed somewhat.

To obtain multi-layer conductor assemblies, a second deposition of an augmentation replacement conductor is effected by the procedures described above. When interconnection between layers is desired, the metal powder ink must, of course, be applied such that at least a portion thereof substantially contacts the first conductor at the gaps or holes in the dielectric. In other words, the second conductor pattern ink will dip down and touch the first conductor or come extremely close thereto where the gaps or holes in the dielectric are encountered. During the augmentation replacement reaction, the metal particles at the surface of the second metal powder ink will be replaced by a metallic film of the more noble metal in solution and, in addition, the metal film on the surface of the first conductor pattern will also be replaced to some extent, and a layer of more noble metal formed, so that an electrical connection between the conductors is established. It will, therefore, be appreciated that the metal of the metal salt in the second solution must be more noble than both the metal in the second metal ink powder and the metal which forms the surface in the first conductor. In the presently preferred embodiment, it is desired to replace the iron particles in the second ink and the metal in the top layer of the first conductor with copper from a copper sulfate solution. As a result, it is necessary that the outermost surface of the first conductor is less noble than copper either by use of a less noble metal initially, or by the additional use of a subsequent coating step, e.g. the tin deposition step described above. The result of this procedure is a relatively thick film of copper conductor on both the top and bottom conductors and one which connects the top and bottom conductors wherever they meet at a gap or hole in the dielectric. It will be appreciated that whenever additional layers are desired, the process can be repeated for each layer.

FIG. 1 shows a two-layer circuit in which the bottom or lower conductors lie upon the Y axis and the top or upper conductors lie along the X axis. This assembly is shown in cross-section in FIG. 2. There are four bottom conductors 101, 102, 103 and 104. The four top conductors 105, 106, 107 and 108 and are separated from bottom conductors 101, 102, 103 and 104 by four strips of dielectric material 109, 110, 111 and 112. In this figure, dielectric strips 109, 110, 111 and 112 lie along the X axis below top conductors 105, 106, 107 and 108. Alternatively, dielectric strips running along the Y axis and overlying bottom conductors 101, 102, 103 and 104 could have been used or the dielectric material could have covered the entire surface of the substrate 113, including the bottom conductors carried thereon. Interconnection holes 114, 115, 116 and 117 are present in the dielectric at the point of intersection of conductors 101 and 105, 102 and 106, 103 and 107, and 104 and 108, respectively, to provide interlayer electrical contact.

FIG. 3 shows a dielectric strip 301 after application to a conductor but before any heating or curing in accordance with this invention. Printing screen marks 302 and pin holes 303 are evident. Dielectric 301 contains two gaps or holes 304 and 305. Hole 304 lies along the central longitudinal axis of the dielectric strip while hole 305 is slightly offset from that axis. FIG. 4 shows the dielectric strip of FIG. 3 after the heating and curing steps of the present invention. It will be noted that the printing screen marks 302 and pin holes 303 are no longer visible and also that holes 304 and 305 have shrunk in size as a result of the heating. A cross-section of the dielectric of FIG. 4 is shown in FIG. 5 and a gentle sloping of the hole walls and dielectric edges will be noted. This is a result of the outflow of the dielectric material during the heating before curing.

In order to further illustrate the present invention, various examples are set forth below. It will be appreciated that these examples are set forth in order to further illustrate the invention, but are not intended to limit it. Further, it should be appreciated that all parts and percentages are by weight and all temperatures in degrees Celsius throughout this specification and claims unless otherwise indicated.

EXAMPLE 1

A low cost conductor system was prepared by printing 5×0.05 inch conductor patterns using a semi-automatic screen printing machine and 165 mesh stainless steel screens. The printing ink contained 77% iron powder, 12% polyester (commercially available GE polyester 73517), 1% of T-butylperbenzoate catalyst and 11% diethylene glycol monobutyl ether solvent. The patterns were dried by subjection to 120° C. for 20 minutes and then cured by baking at a temperature of 180° C. for 20 minutes. The conductivity of the resulting cured polymer ink was found to be about 30 Kohm per square for a 1 mil thick deposit. The patterned substrate was then immersed into a 133 ml aqueous solution containing 40 grams of copper sulfate pentahydrate and 7 grams of sulfuric acid which was maintained at about 55° C. After 5 minutes, the resistance was determined to be 0.3 ohms, i.e. 3.0 milliohms/sq.

EXAMPLE 2

The conductor pathways in the conductor designed substrate of Example 1 were overprinted with UV 1003 (a commercially available dielectric material) loaded with sufficient silica flour to form a thixotropic paste, by means of screen printing. Pin holes, bubbles and screen marks were evident. The substrate was then placed on a laboratory hot plate maintained at 125° C. for 30 seconds and then placed under a UV curing lamp for 5 seconds. As a result, a very smooth dielectric layer free of pin holes and with improved wetting and adherence to the substrate, as well as reduced sharp wall definition, was obtained.

EXAMPLE 3

Example 2 was repeated except that prior to application of the dielectric, the copper surface of the conductor was plated with tin by immersing the substrate in Coppertech Electroless Tin Plating Solution ST-210 resulting in a reaction which was self-quenching in that after 50 microinches of metal had been plated out, the reaction stopped. Also, the dielectric employed was Dynacure mixing base GA80M, printed through a 325 mesh stainless steel screen.

The conductor patterns fabricated and insulator patterns fabricated were those shown in FIG. 1 as 101–104 and 109–112, respectively, including the through holes or gaps in the insulator material shown as 114–117. A second set of conductors in the configuration shown in FIG. 1 as 105–108 was then fabricated by the procedure set forth in Example 1 above. It was determined that the resulting conductors could be soldered, the interconnections were reliable and the dielectric could withstand voltages in excess of 1000 volts. It should be appreciated that this assembly could be made into a three conductor layer multi-layer circuit if a hole or gap had been drilled or otherwise provided in the insulator covering the steel substrate so that an electrical connection between the first conductors and the substrate would be effected.

EXAMPLE 4

In this example, a multilayer circuit board is fabricated. A 2 oz. copper-clad printed circuit board was coated with Laminar AX photoresist, available from Dynachem Co. The board was exposed in a vacuum table arc-lamp for 1 minute. The photoresist was developed in Dynachem KB1 developer for 2 minutes. The board with patterned photoresist was then placed in a ferric chloride spray etcher for 3 minutes to etch the desired copper pattern. The board was then drilled for component leads. Next the board was immersed in Coppertech Electroless Tin Plating Solution ST210, resulting in a thin (50 microinch) layer of tin being plated on the copper conductor pattern.

Dynachem GA80M UV mixing base dielectric was printed through a 325 mesh screen with holes where the connection to the lower conductor were desired. The dielectric was cured for 5 seconds under high intensity UV light.

A second conductor pattern was then printed using the same conductor pattern ink as described in Example 1. After drying for 20 minutes at 120° C. and curing for 20 minutes at 180° C., the printed circuit board was immersed in the copper-sulfate solution described in Example 1. The result was a multilayer circuit consisting of a lower conductor layer formed by conventional printed circuit techniques and an upper conductor layer formed by augmentative replacement with a dielectric layer separating the two conductor layers. In addition, high conductivity interconnections between the two conductor layers was provided wherever the connection holes occurred in the dielectric.

EXAMPLE 5

In this example, an additonal conductor layer is added to a conventional double-sided plated-thru-hole printed circuit board. First, a double-sided plated-thru-hole circuit board was processed according to the following procedure: drill required holes in a double-sided ⅛ oz. copper clad G-10 laminate. Clean, pumice abrade and rinse the board. Immerse for 5 minutes in Dynachem PTH150, rinse, immerse for 3 minutes in copper microetchant, immerse for 1 minute in $H_2SO_4$ solution, rinse for 1 minute, then dip in hydrochloric acid solution for 3 minutes, rinse, and activate the board by immersion for 5 minutes in Dynaplate Activator 180. Rinse for 2 minutes, immerse for 6 minutes in Dynaplate Conditioner 101, and immerse in Dynaplate 240 for 10–15 minutes. At this point, the board was rinsed, scrubbed and immersed in a 10% $H_2SO_4$ solution. Dynachem Laminar AX photoresist was applied and the the board was exposed and developed.

Two plating steps followed; first, a 30 minute bath in copper-sulfate copper plating solution at 100 mA/sq. inch; and then 15 minutes in Kepro PbSn5 g fluoroboric solder plating bath at 200 mA/sq. inch. At this point, the photoresist was stripped and the board etched in Shipley Etchant CR-10 chromic sulphuric acid etch. The result to this point was a solder-plated double-sided printed circuit board.

Subsequently, a layer of 2 part thermally-curing epoxy soldermask was screen printed on the board and cured. The solder mask acted as a mask for subsequent soldering operations as well as a crossover dielectric for the third layer of conductor. There were holes in the dielectric for both component soldering and for connection to the lower conductor layer.

Next, a conductor pattern was screened, and cured according to Example 1. The board was dipped in a solution of copper-sulfate, as described in Example 1. Finally, the board was dipped in an electroless solder plating bath of Dynachem ST210. The result was a 3 layer plated-thru-hole printed circuit board with solder mask in place, ready for component-mounting and subsequent wave-soldering operations.

EXAMPLE 6

A 3×5 inch steel substrate was cleaned in Oakite 31 at 90° C. for 2 minutes and rinsed. The substrate was then printed with a dielectric pattern through a 325 mesh screen, using Dynachem GA80m mixing base. The printed dielectric pattern was cured for 5 seconds under high intensity UV light. The dielectric pattern was so arranged that holes occurred to allow connection of subsequent layers of conductor to the substrate. The steps of Example 3 were then carried out, resulting in an insulated steel substrate, multilayer circuit board; 1000 volt breakdown to the steel, and between conductor layers, was obtained. In addition, good conductivity between layers was also obtained.

Various changes and modifications can be made in the process and products of this invention without departing from the spirit and scope thereof. The various embodiments which have been set forth herein were described for the purpose of further illustrating the invention but were not intended to limit it.

What is claimed is:

1. A multi-layer electrical conductor pattern adhered to an insulative substrate surface, comprising: a first conductor pattern fabricated upon said substrate surface; a layer of dielectric material covering at least part of said first conductor pattern; and a second conductor pattern comprising; a first polymer adhering to at least a portion of said dielectric layer and at least a portion of said first conductor pattern; a finely divided first metallic composition having a particle size greater than about 3 microns and less than about 50 microns and a second metal, both contained within said first polymer; and a contiguous layer of said second metal on said first polymer, wherein said second metal is more noble than the metal of said first metallic composition.

2. The electrical conductor pattern of claim 1, wherein said layer of dielectric material is heat treated to eliminate holes through said layer, except at desired interconnection locations.

3. The electrical conductor pattern of claim 2, wherein said first conductor pattern comprises: a second polymer; a finely divided third metallic composition having a particle size greater than about 3 microns and less than about 50 microns and a fourth metal, both contained within said second polymer; and a contiguous layer of said fourth metal on said second polymer; said second polymer substantially contacting the first conductor pattern at at least one point not covered by said layer of dielectric material, wherein said fourth metal is more noble than the metal of said third metallic composition, said contiguous layer of said fourth metal also in electrical connection with said contiguous layer of said second metal.

4. The electrical conductor pattern of claim 3, wherein said dielectric material comprises an ultra-violet cured epoxy resin.

5. The electrical conductor pattern of claim 4, wherein said first and second polymers comprise polyesters.

6. The electrical conductor pattern of claim 3, further comprising: an outermost layer, with respect to said substrate, disposed on said contiguous layer of said fourth metal and being a contiguous layer of a fifth metal, which is less noble than the fourth metal.

7. The electrical conductor pattern of claim 6, wherein said fourth metal and said second metal comprise copper.

8. The electrical conductor pattern of claim 7, wherein said fifth metal comprises tin and wherein the metal of said first metallic composition and the metal of said third metallic composition both comprise iron.

9. The electrical conductor pattern of claim 8, wherein said dielectric material is a cured epoxy resin.

10. The electrical conductor pattern of claim 2, wherein said dielectric material comprises an ultra-violet cured epoxy resin.

11. The electrical conductor pattern of claim 10, wherein said first and second polymers comprise polyesters.

12. The electrical conductor pattern of claim 1, wherein said first conductor pattern is a printed circuit pattern etched in a plane of a third metal and adhering to a surface of said substrate.

13. The electrical conductor pattern of claim 1, wherein said first conductor pattern comprises: a second polymer; a finely divided third metallic composition having a particle size greater than about 3 microns and less than about 50 microns and a fourth metal, both contained within said second polymer; and a contiguous layer of said fourth metal on said second polymer; said first polymer substantially contacting the first conductor pattern at at least one point not covered by said layer of dielectric material, wherein said fourth metal is more noble than the metal of said third metallic composition, said contiguous layer of said fourth metal also in electrical connection with said contiguous layer of said second metal.

14. The electrical conductor pattern of claim 13, further comprising: an outermost layer of said first conductor pattern with respect to said substrate, disposed on said contiguous layer of said fourth metal and being a contiguous layer of a fifth metal, which is less noble than the fourth metal.

15. The electrical conductor pattern of claim 14, wherein said fourth metal and said second metal comprise copper.

16. The electrical conductor pattern of claim 15, wherein said fifth metal comprises tin and wherein the metal of said first metallic composition and the metal of said third metallic composition both comprise iron.

17. The electrical conductor pattern of claim 16, wherein said dielectric material comprises a cured epoxy resin.

18. The electrical conductor pattern of claim 13, wherein said dielectric material comprises an ultra-violet cured epoxy resin.

19. The electrical conductor pattern of claim 18, wherein said first and second polymers comprise polyesters.

* * * * *